(12) United States Patent
van de Ven et al.

(10) Patent No.: US 8,362,499 B2
(45) Date of Patent: *Jan. 29, 2013

(54) SOLID STATE EMITTER PACKAGES INCLUDING ACCESSORY LENS

(75) Inventors: Antony Paul van de Ven, Hong Kong (CN); Gerald H. Negley, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 79 days.

This patent is subject to a terminal disclaimer.

(21) Appl. No.: 13/008,898

(22) Filed: Jan. 18, 2011

(65) Prior Publication Data

US 2011/0133223 A1 Jun. 9, 2011

Related U.S. Application Data

(63) Continuation of application No. 12/614,553, filed on Nov. 9, 2009, now Pat. No. 7,893,445.

(51) Int. Cl.
*H01L 33/00* (2010.01)
(52) U.S. Cl. ....... 257/89; 257/98; 257/99; 257/E33.066; 257/E33.072
(58) Field of Classification Search .......... 257/89, 257/98, 99, E33.066, E33.072
See application file for complete search history.

(56) References Cited

U.S. PATENT DOCUMENTS

| | | | |
|---|---|---|---|
| 3,875,456 A | 4/1975 | Kano et al. | |
| 6,577,073 B2 | 6/2003 | Shimizu et al. | |
| 6,683,423 B2 | 1/2004 | Cunningham | |
| 6,812,498 B1 | 11/2004 | Moon | |
| 7,005,679 B2 | 2/2006 | Tarsa et al. | |
| 7,095,056 B2 | 8/2006 | Vitta et al. | |
| 7,213,940 B1 | 5/2007 | van de Ven et al. | |
| 7,282,740 B2 | 10/2007 | Chikugawa et al. | |
| 7,456,499 B2 | 11/2008 | Loh et al. | |
| 7,564,180 B2 | 7/2009 | Brandes | |
| 7,875,899 B2 | 1/2011 | Yasuda | |
| 7,893,445 B2 * | 2/2011 | van de Ven et al. | ............. 257/89 |
| 2004/0079957 A1 | 4/2004 | Andrews et al. | |
| 2004/0126913 A1 | 7/2004 | Loh | |
| 2005/0121686 A1 | 6/2005 | Keller et al. | |
| 2005/0251698 A1 | 11/2005 | Lynch et al. | |
| 2005/0269587 A1 | 12/2005 | Loh et al. | |
| 2006/0152140 A1 | 7/2006 | Brandes | |
| 2007/0063321 A1 | 3/2007 | Han et al. | |
| 2007/0170447 A1 | 7/2007 | Negley | |

(Continued)

FOREIGN PATENT DOCUMENTS

JP 2003-273404 A 9/2003
WO 2007084640 A2 7/2007

(Continued)

*Primary Examiner* — Minh-Loan T Tran
(74) *Attorney, Agent, or Firm* — Vincent K. Gustafson; Jenkins, Wilson, Taylor & Hunt, P.A.

(57) ABSTRACT

A solid state emitter package may include at least one electrically conductive path associated with the solid state emitter package that is not in electrical communication with any solid state emitter of the solid state emitter package, with such electrically conductive path being susceptible to inclusion of a jumper or a control element. A solid state emitter package includes a principally red solid state emitter having peak emissions within 590 nm to 680 nm, a principally blue solid state emitter having peak emissions within 400 nm to 480 nm, and at least one of a common leadframe, common substrate, and common reflector, with the package being devoid of any principally green solid state emitters having peak emissions between 510 nm and 575 nm.

20 Claims, 6 Drawing Sheets

U.S. PATENT DOCUMENTS

| | | |
|---|---|---|
| 2007/0223219 A1 | 9/2007 | Medendorp et al. |
| 2007/0253209 A1 | 11/2007 | Loh et al. |
| 2008/0006837 A1 | 1/2008 | Park et al. |
| 2008/0012036 A1 | 1/2008 | Loh et al. |
| 2008/0101085 A1 | 5/2008 | Lin et al. |
| 2008/0121921 A1 | 5/2008 | Loh et al. |
| 2008/0130265 A1 | 6/2008 | Negley |
| 2008/0308825 A1 | 12/2008 | Chakraborty et al. |
| 2010/0270567 A1 | 10/2010 | Emerson et al. |
| 2011/0068698 A1 | 3/2011 | Swoboda et al. |

FOREIGN PATENT DOCUMENTS

| | | |
|---|---|---|
| WO | 2010001696 A1 | 1/2010 |

\* cited by examiner

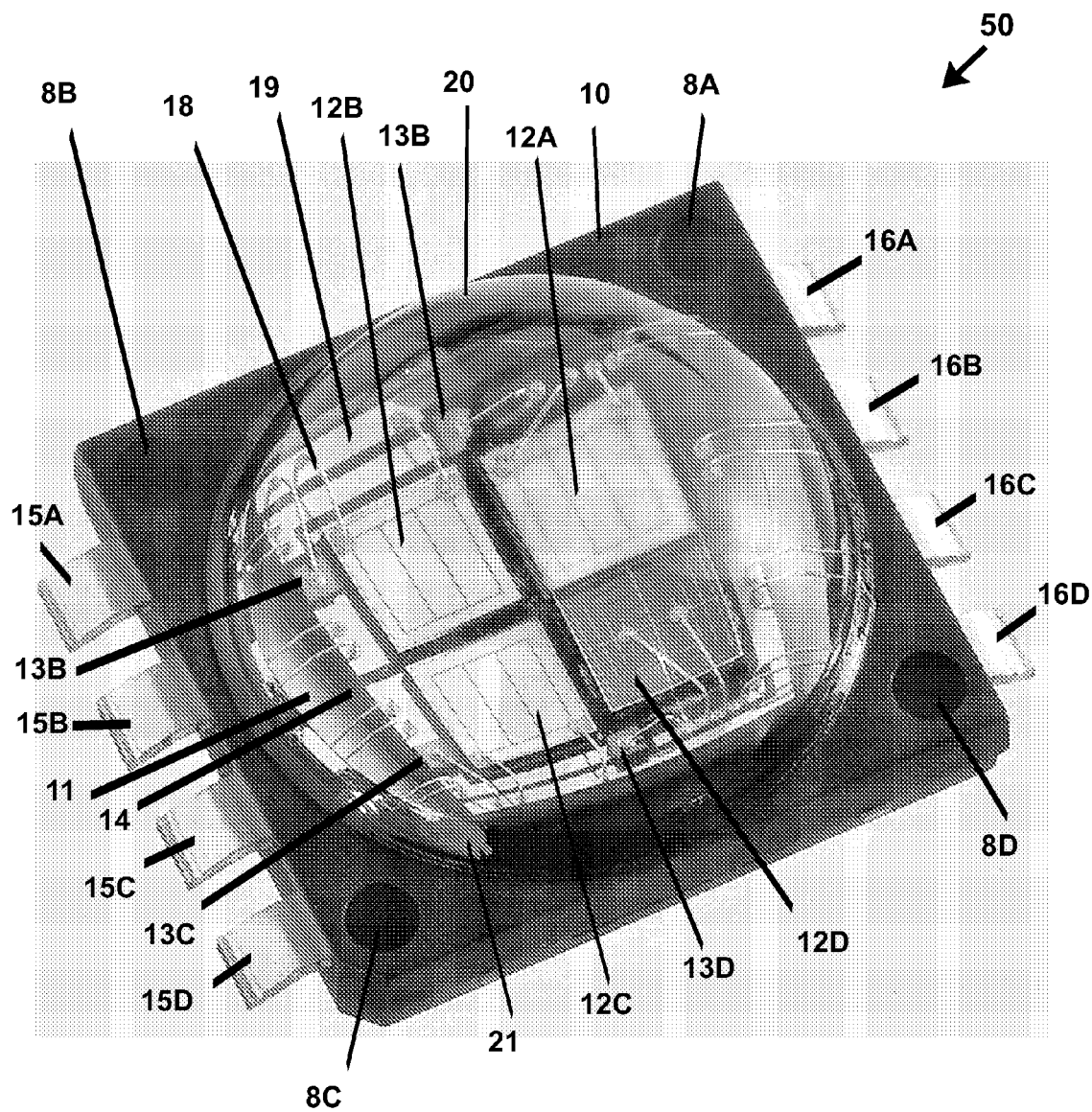
FIG._1

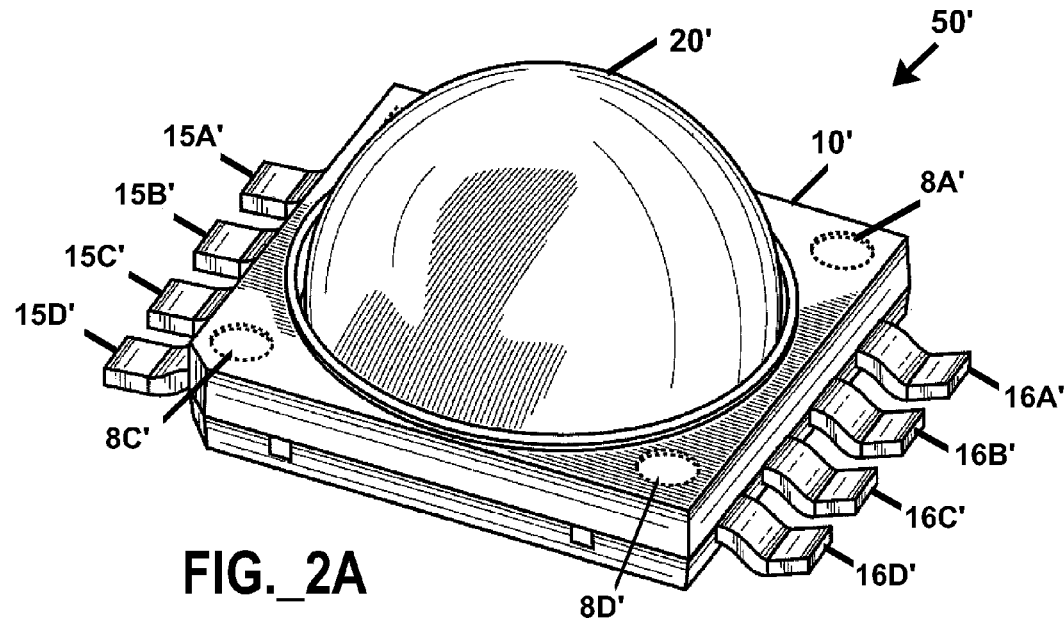
FIG._2A
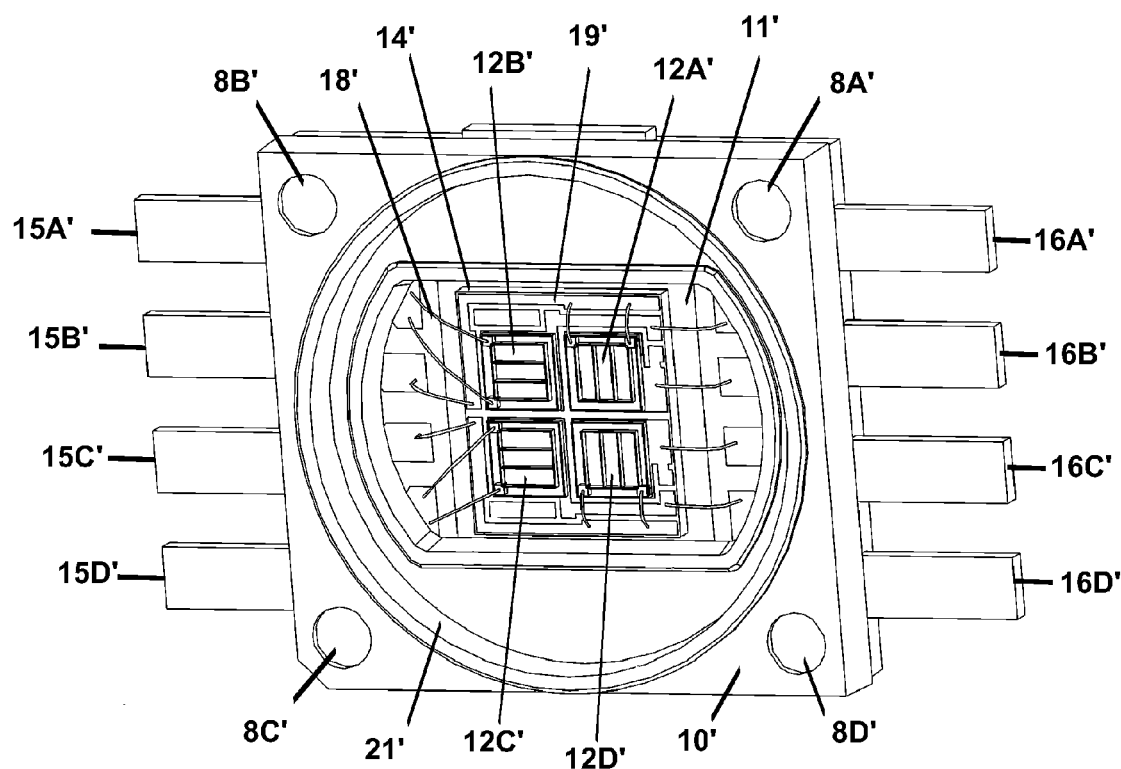
FIG._2B

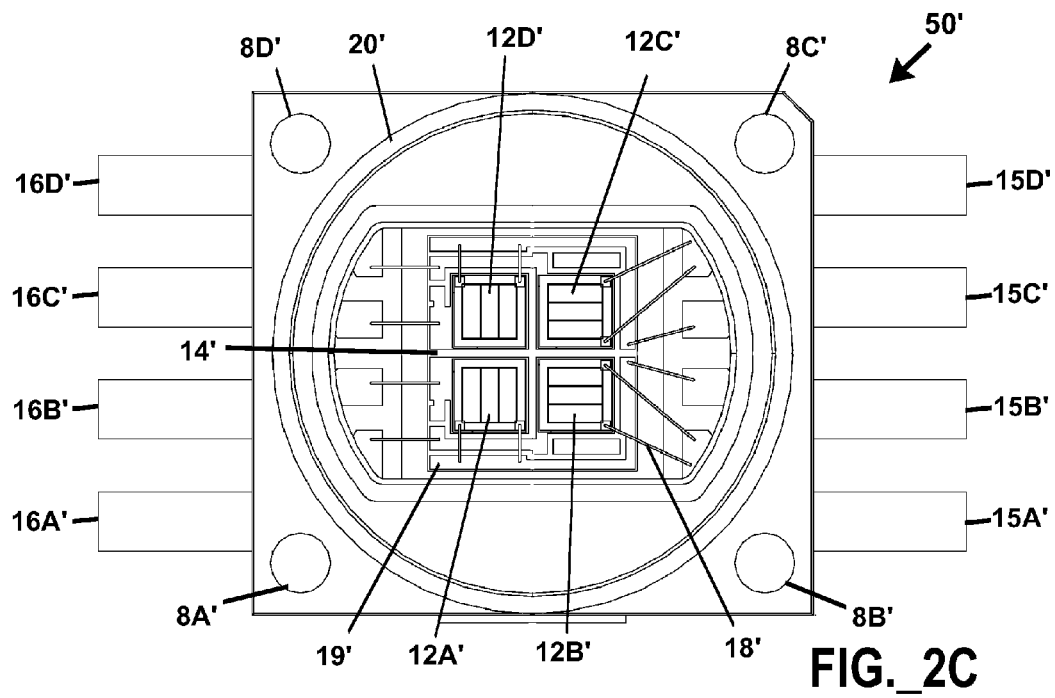
FIG._2C
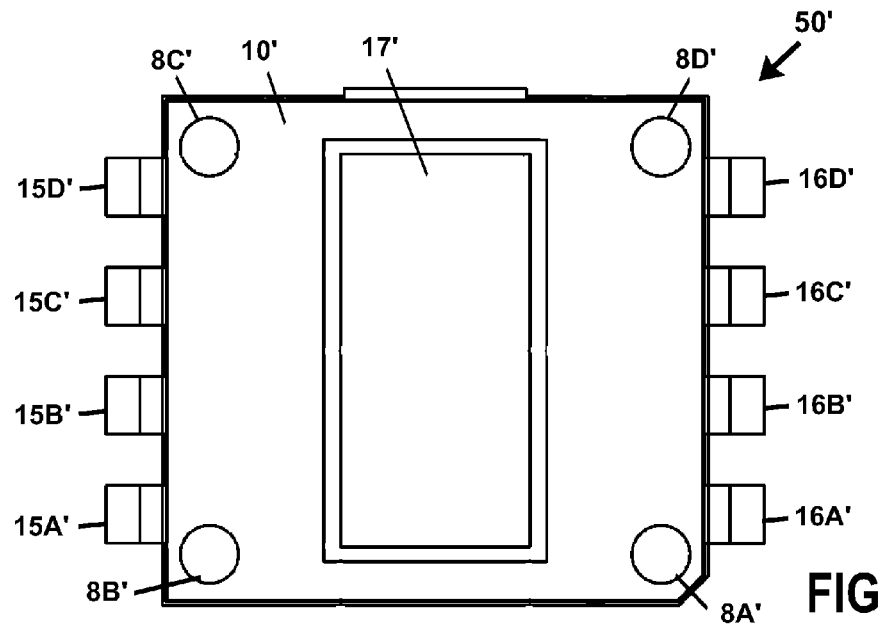
FIG._2D

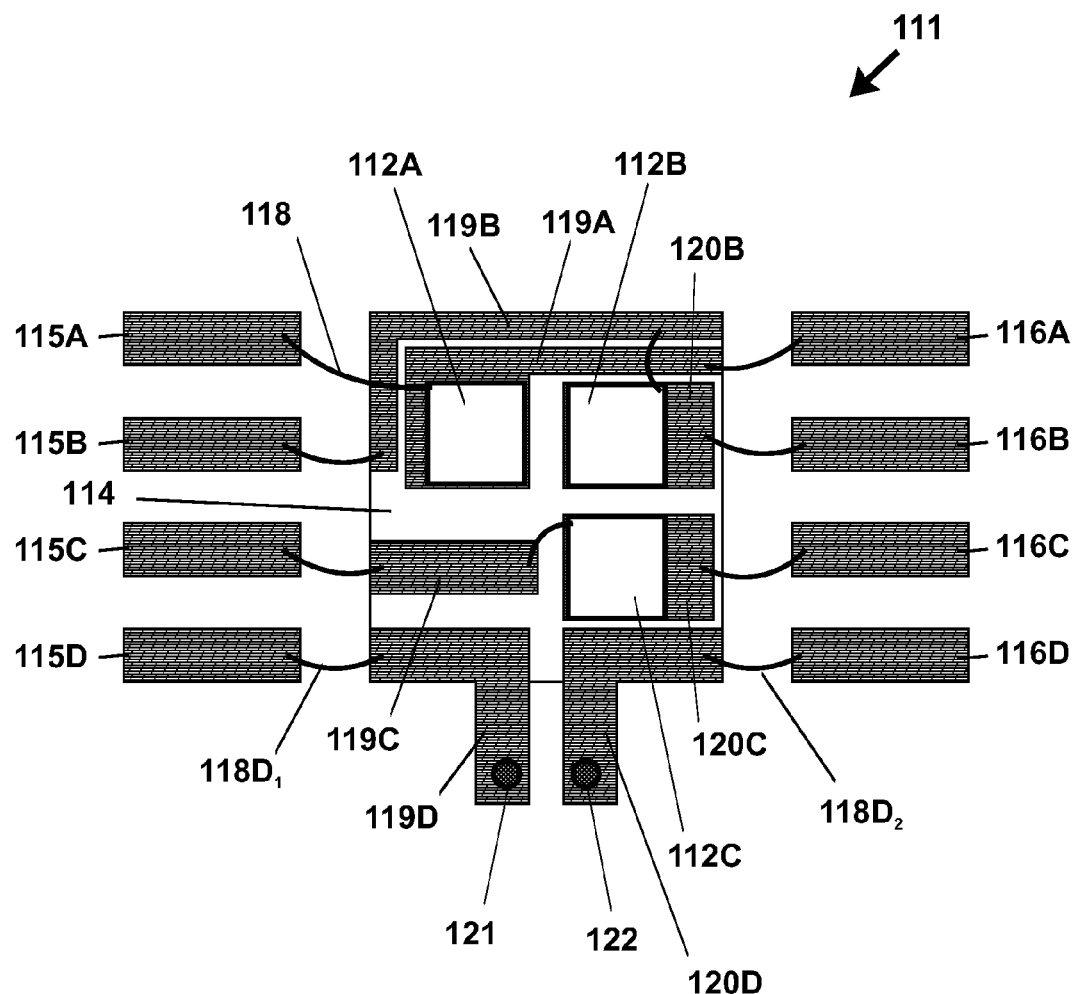
FIG._3

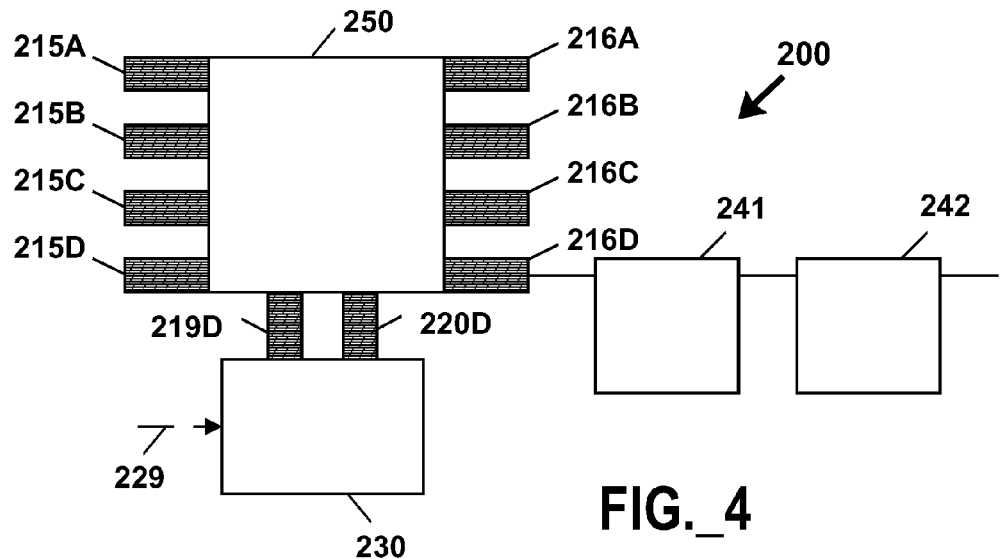
FIG._4
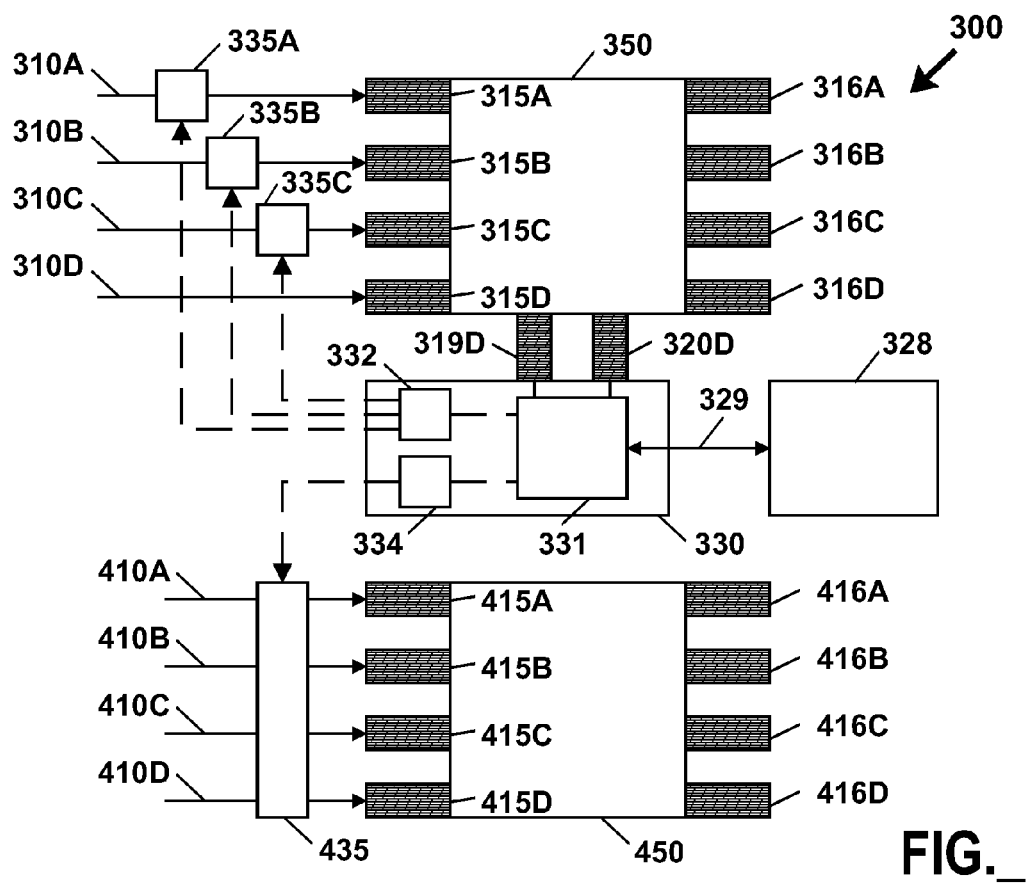
FIG._5

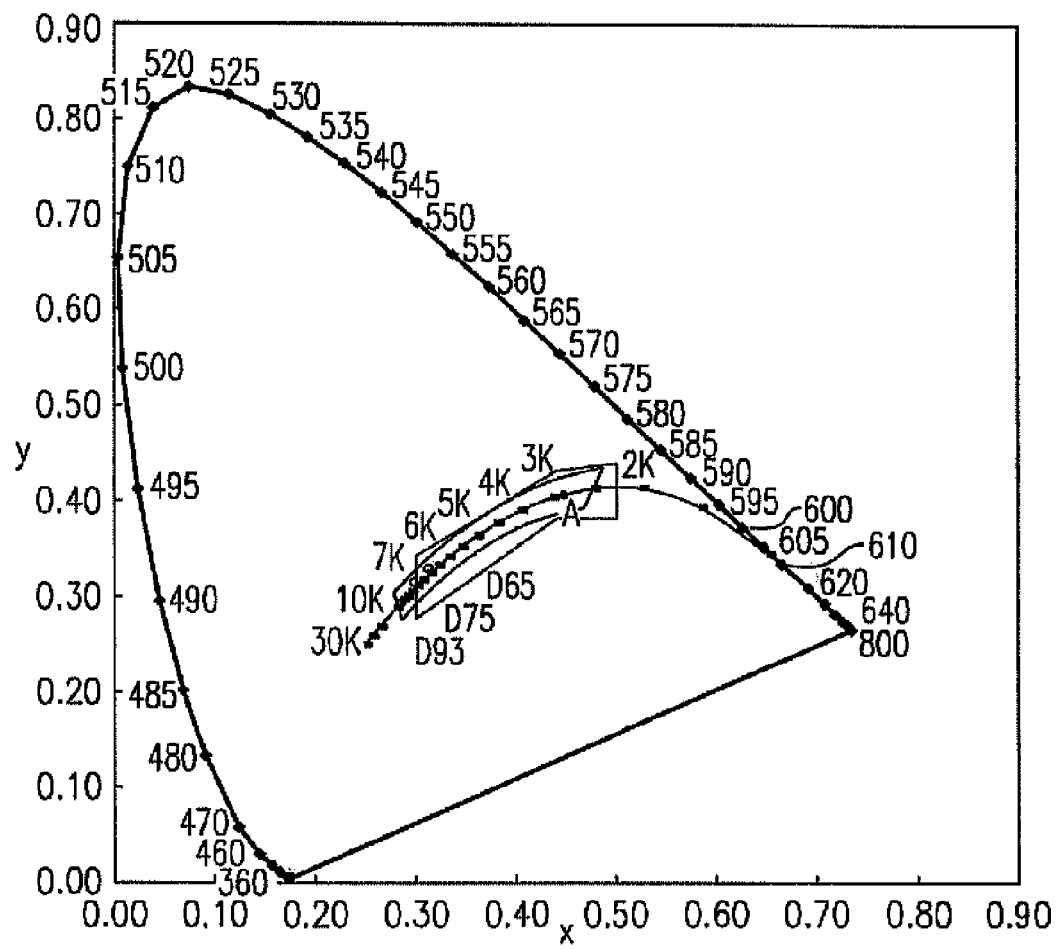
FIG._6

SOLID STATE EMITTER PACKAGES INCLUDING ACCESSORY LENS

STATEMENT OF RELATED APPLICATION(S)

This is a continuation of U.S. patent application Ser. No. 12/614,553 filed on Nov. 9, 2009, and subsequently issued as U.S. Pat. No. 7,893,445 on Feb. 22, 2011. The disclosures of the foregoing application and patent are hereby incorporated by reference as if set forth fully herein.

TECHNICAL FIELD

The present invention relates to solid state light emitters, including packages for solid state light emitters and devices incorporating same.

BACKGROUND

Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80).

Solid state light sources may be utilized to provide colored (e.g., non-white) or white LED light (e.g., perceived as being white or near-white), as has been investigated as potential replacements for white incandescent lamps. A solid state lighting device may include, for example, at least one organic or inorganic light emitting diode ("LED") or a laser. A representative example of a white LED lamp includes a package of a blue LED chip, made of InGaN and/or GaN, coated with a phosphor (typically YAG:Ce or BOSE). Blue LEDs made from InGaN exhibit high efficiency (e.g., external quantum efficiency as high as 60%). In a blue LED/yellow phosphor lamp, the blue LED chip produces an emission with a wavelength of about 450 nm, and the phosphor produces yellow fluorescence with a peak wavelength of about 550 nm upon receipt of the blue emission. Part of the blue ray emitted from the blue LED chip passes through the phosphor, while another portion of the blue ray is absorbed by the phosphor, which becomes excited and emits a yellow ray. The viewer perceives an emitted mixture of blue and yellow light as white light. A blue LED and yellow phosphor device typically good efficacy but only medium CRI Ra (e.g., between 70 and 80), or very good CRI Ra and low efficacy.

Various methods exist to enhance cool white light to increase its warmth. To promote warm white colors, an orange phosphor or a mix of red and yellow phosphor can be used. Cool white emissions from a white emitter may also be supplemented with red and/or cyan LEDs, such as disclosed by U.S. Pat. No. 7,095,056 (Vitta) to provide warmer light.

As an alternative to stimulating a yellow phosphor with a blue LED, another method for generating white emissions involves combined use of red, green, and blue ("RGB") light emitting diodes in a single package. The combined spectral output of the red, green, and blue emitters may be perceived by a user as white light. Each "pure color" red, green, and blue diode typically has a full-width half-maximum (FWHM) wavelength range of from about 15 nm to about 30 nm. Due to the narrow FWHM values of these LEDs (particularly the green and red LEDs), light made from combinations of red, green, and blue LEDs may exhibit low efficacy in general illumination applications.

Another example of a known white LED lamp includes a package including ultraviolet (UV) based LEDs combined with red, green, and blue phosphors. Such lamps provide acceptably high color rendering, but exhibit low efficacy due to Stokes losses.

It is known to mount solid state light sources, such as semiconductor light emitting devices in packages that may provide protection, color enhancement, focusing, and similar utilities for light emitted by a light emitting device. Examples of such packages are disclosed in U.S. Patent Application Publication Nos. 2005/0269587, 2004/0126913, and 2004/0079957.

Output efficiency and thermal management present ongoing concerns with known solid state emitter devices. Certain end uses such as grow lights to promote photosynthesis obtain limited benefit from solid state light sources intended for illumination pleasing to a human viewer. Solid state emitter packages as described in the above-referenced publications may be suitable for high power, solid state illumination applications; however, factors such as controllability, output efficiency, thermal management, and manufacturability present ongoing concerns. There remains a need for improved packages each including multiple LEDs (e.g., with features to enhance or tailor light output quality, efficiency, thermal properties, and/or controllability for a desired end use), and a need for improved devices incorporating such packages.

SUMMARY

The present invention relates to solid state light emitters, including packages for solid state light emitters and devices incorporating same.

In one aspect, the invention relates to a solid state emitter package including: at least two solid state emitters; and at least two conductive leads in electrical communication with one another, wherein the at least two conductive leads are not in electrically conductive communication with any solid state emitter of the at least two solid state emitters.

In another aspect, the invention relates to a solid state emitter package including a plurality of solid state emitters, at least two first conductive leads in electrical communication with the plurality of solid state emitters; and at least two second conductive leads in electrical communication with one another, wherein the at least two second conductive leads are not in electrically conductive communication with any solid state emitter of the at least two solid state emitters.

In another aspect, the invention relates to a solid state emitter package including: a plurality of solid state emitters; a plurality of conductive leads in electrical communication with the plurality of solid state emitters; and at least two spatially separated conductive leads in electrical communication with at least one electrically conductive path associated with the solid state emitter package, wherein the at least one electrically conductive path is not in electrically conductive communication with any solid state emitter of the solid state emitter package.

In another aspect, the present invention relates to a solid state emitter package including a plurality of solid state emitters consisting of at least one principally red solid state emitter having peak emissions within a wavelength range of from 590 nm to 680 nm, and at least one principally blue solid state emitter having peak emissions within a wavelength range of from 400 nm to 480 nm, wherein the solid state emitter package is devoid of any principally green solid state emitters having peak emissions within a wavelength range of between 510 nm and 575 nm. The solid state emitter package includes at least one of the following elements (a) to (c): (a) a common leadframe including a plurality of conductive leads arranged to supply current to the plurality of solid state emitters; (b) a common substrate arranged to structurally support the plurality of solid state emitters; and (c) a common reflector arranged to reflect light emissions of each solid state emitter of the plurality of solid state emitters.

In another aspect, the invention relates to a solid state emitter package including a plurality of solid state emitters including: (i) at least one principally red solid state emitter having peak emissions within a wavelength range of from 590 nm to 680 nm, (ii) at least one principally blue solid state emitter having peak emissions within a wavelength range of from 400 nm to 480 nm, and (iii) at least one supplemental solid state emitter having peak emissions within a wavelength range of from 480 nm to below 510 nm or a wavelength range of from above 575 nm to 590 nm. The solid state emitter package is devoid of any principally green solid state emitter having peak emissions within a wavelength range of between 510 nm and 575 nm, and the solid state emitter package includes at least one of the following elements (a) to (c): (a) a common leadframe including a plurality of conductive leads arranged to supply current to the plurality of solid state emitters; (b) a common substrate arranged to structurally support the plurality of solid state emitters; and (c) a common reflector arranged to reflect light emissions of each solid state emitter of the plurality of solid state emitters.

Other aspects, features and embodiments of the invention will be more fully apparent from the ensuing disclosure and appended claims.

BRIEF DESCRIPTION OF THE DRAWINGS

FIG. 1 is an upper perspective view of an emitter device package including four solid state emitter diodes arranged in a unitary package and capable of producing white light.

FIG. 2A is an upper perspective view of an emitter device package substantially similar to the package of FIG. 1, with a lens covering the multiple emitter diodes.

FIG. 2B is an upper perspective view of a portion of the emitter device package of FIG. 2A, showing the package without the lens to expose the emitter diodes and associated structures.

FIG. 2C is a top view of the emitter device package portion of FIG. 2B.

FIG. 2D is a bottom view of the emitter device package of FIGS. 2A-2C.

FIG. 3 is a simplified top view of a portion of a multi-emitter device package, including three emitters and a conductive path independent of the emitters arranged to receive a jumper.

FIG. 4 is a simplified top view of at least a portion of a lighting system including a multi-emitter device package having three emitters and a conductive path independent of the three emitters, with the system including multiple electrically operable elements external to the multi-emitter device package in electrical communication with the conductive path.

FIG. 5 is a simplified top view of at least a portion of a lighting system including a first multi-emitter device package having multiple emitters and a conductive path independent of the three emitters, with at least one control element coupled to the conductive path to affect operation of at least one of the first multi-emitter device package and a second multi-emitter device package.

FIG. 6 is a CIE diagram illustrating the blackbody locus and a region of white light.

DETAILED DESCRIPTION

The present invention now will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey the scope of the invention to those skilled in the art. In the drawings, the size and relative sizes of layers and regions may be exaggerated for clarity.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, no intervening elements are present. It will also be understood that when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

As used herein, the terms solid state light emitter or solid state light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LEDs or lasers fabricated on a silicon carbide substrate such as those devices manufactured and sold by Cree, Inc. of Durham, N.C. Such LEDs and/or lasers may be configured to operate such that light emission occurs through the substrate in a so-called "flip chip" orientation.

A solid state emitter as disclosed herein can be saturated or non-saturated. The term "saturated" as used herein means having a purity of at least 85%, with the term "purity" having a well-known meaning to those skilled in the art, and procedures for calculating purity being well-known to those skilled in the art.

One aspect of the invention relates to use of at least one principally red solid state emitter and at least one principally blue solid state emitter in a solid state emitter package that is devoid of any principally green solid state emitter. The at least one principally red emitter and the at least one principally blue solid state emitter each preferably comprise at least one LED. The emitter package preferably includes at least one, more preferably at least two, and still more preferably all three, of the following features (a) to (c): (a) a common leadframe including a plurality of conductive leads arranged to supply current to the solid state emitters; (b) a common substrate arranged to structurally support the solid state emitters; and (c) a common reflector arranged to reflect light emissions of each solid state emitter of the plurality of solid state emitters.

Placing both principally red and principally blue emitters in a single package may enhance color mixing by placing the different color sources close together. Principally blue emitters such as InGaN-based LEDs are desirably used due to their high efficiency. Principally red emitters such as red LEDs are desirably used to enhance warmth and spectral width of the resulting mixed light. Relative to principally red emitters, principally green emitters such as green LEDs are not as useful to enhance warmth of light sourced from principally blue emitters, and relative to principally blue emitters, principally green emitters (e.g., green LEDs) are less efficient. As a result, Applicants have found that green LEDs may be omitted from a solid state emitter package including at least one principally red solid state emitter and at least one principally blue solid state emitter, without negatively impacting efficiency. Moreover, in certain end uses that do not benefit from green light, the omission of a principally green emitter eliminates needless inclusion of a principally green emitter and attendant wasted energy. For example, green leaves of plants readily absorb red light and blue light, but reflect green light. No benefit is realized by including a principally green solid state emitter in a grow lamp intended to promote plant growth by emission of an electromagnetic spectrum appropriate for photosynthesis.

The term "principally red" as applied to a solid state emitter herein refers to an emitter having peak emissions within a wavelength range of preferably from about 590 nm to about 680 nm, more preferably from about 595 to about 675 nm, more preferably from about 600 to about 670 nm, and still more preferably from about 610 to about 660 nm.

The term "principally blue" as applied to a solid state emitter herein refers to an emitter having peak emissions within a wavelength range of preferably from about 400 nm to about 480 nm, more preferably from about 405 nm to about 475 nm, more preferably from about 410 nm to about 470 nm, and still more preferably from about 420 nm to about 460 nm.

The term "principally green" as applied to a solid state emitter herein refers to an emitter having peak emissions within a wavelength range of preferably from 510 nm to 575 nm, or more preferably between 510 nm and 575 nm.

The terms "multi-emitter package" or simply "emitter package" as used herein refers generally to a light emission device including multiple solid state emitters in conjunction with at least one of a common leadframe, a common submount, and a common reflector.

While solid state emitters and lumiphoric materials are recognized to have relatively narrow wavelength emission ranges (e.g., full width/half maximum wavelength spectra of less than about 20 nm in many instances), is to be understood that assignment of individual colors to such emitters and conversion materials refers to peaks or centers of output wavelengths. That is, individual emitters and lumiphoric materials typically have dominant or peak wavelengths where emissions are maximized, but an individual emitter or lumiphoric material may emit a range of other wavelengths (typically at substantially reduced intensity and efficiency) than its dominant or peak wavelength.

In one embodiment, a solid state emitter package comprises a plurality of solid state emitters including at least one principally red solid state emitter, and including at least one principally blue solid state emitter, may be supplemented with at least one supplemental solid state emitter having peak emissions within a wavelength range of from 480 nm to below 510 nm (e.g., principally cyan) or a wavelength range of from above 575 nm to 590 nm (e.g., principally yellow and/or amber). The plurality of solid state emitters is also devoid of any principally green solid state emitter. The at least one supplemental solid state emitter serves to reduce spectral gaps in the aggregated spectral output of the package, while avoiding peak emissions within a principally green spectrum. The emitter package preferably includes at least one, more preferably at least two, and still more preferably all three, of the following features (a) to (c): a common leadframe including a plurality of conductive leads arranged to supply current to the solid state emitters; (b) a common substrate arranged to structurally support the solid state emitters; and (c) a common reflector arranged to reflect light emissions of each solid state emitter of the plurality of solid state emitters.

Various methods may be used to tailor aggregated emissions of a solid state emitter package as disclosed herein according to a desired end use. In one embodiment, current is independently controllable to each emitter of a plurality of solid state emitters in a solid state emitter package, or, alternatively, to different groups of solid state emitters of different principal colors. Independent control of current to different solid state emitters of different principal colors enables a user to adjust or tune output color, as well as adjust luminous flux. In one embodiment, at least one current adjuster may be directly or switchably electrically connected to each solid state emitter or different groups of solid state emitters, to adjust current. In one embodiment, one or more solid state emitters of a plurality of emitters may be deactivated while current is supplied to other solid state emitters to provide desired luminous flux and/or output color. In one embodiment, the number and/or size of emitters of different principal colors may be adjusted to provide desired luminous flux and/or output color. In one embodiment, any one or more of the foregoing methods for tailoring aggregated emissions of a solid state emitter package may be combined for additional advantage.

In one embodiment, solid state emitters of multiple different principal colors within a package as described herein may be operatively adjusted or controlled to triangulate to one or more points along or near a blackbody locus drawn on a CIE chromaticity diagram, such as shown in FIG. 6 (with the curved line emanating from the 800 nm corner representing the blackbody locus). In one embodiment, the preceding one or more points may be within ten MacAdam ellipses of at least one point on the blackbody locus on a 1931 CIE Chromaticity Diagram.

In one embodiment, a plurality of solid state emitters includes multiple emitters of the same principal color (i.e., principally red, principally blue, principally cyan, principally yellow, and/or principally amber), with multiple emitters of the same principal color having peak emissions of different wavelengths. Such emitters of the same principal color may have peak emissions at wavelengths that differ, with such peak wavelengths in some cases differing by preferably at least about 2 nm, more preferably at least about 4 nm, more preferably at least about 8 nm, more preferably at least about 15 nm, more preferably at least about 30 nm, and still more preferably at least about 40 nm. For example, two principally red LEDs may include a first red emitter having peak emissions at a wavelength of about 640 nm and a second Portland orange LED having peak emissions at 605 nm (representing a difference of 35 nm relative to the 640 nm red LED), and two principally blue LEDs may include a first blue LED having peak emissions at a wavelength of about 450 nm and a second blue LED having peak emissions at a wavelength of about 460 nm. Preferably, current to each emitter is independently controllable. Use of multiple emitters within the same principal color having different peak wavelengths provides enhanced color control capability, and enhances spectral width of aggregated emissions.

In certain embodiments, each solid state emitter of a multi-emitter package is primarily characterized by output emissions in the visible range. Various embodiments of solid state emitter packages as disclosed herein may be devoid of any solid state emitter having peak emissions in the ultraviolet spectrum.

In certain embodiments, a solid state emitter package as disclosed herein may include at least one luminescent (also called lumiphoric') materials, such as phosphors, scintillators, lumiphoric inks) and/or filters, arranged to receive light of an input (or stimulation) wavelength range and convert such light to generate emissions (light) of a different peak wavelength or wavelength range, of any of various desired colors—including combinations of colors that may be perceived as white. Lumiphoric materials may provide up-converting or down-converting utility (i.e., outputting higher peak wavelength or lower peak wavelength spectra, respectively). Inclusion of lumiphoric materials in solid state emitter packages may be accomplished by adding such materials to encapsulants, adding such materials to lenses, or by direct coating of such materials onto one or more LEDs. Lumiphoric materials may be conformally coated on one or more individual solid state emitters. In one embodiment, a thicker coating and/or greater concentration of lumiphoric material (e.g., relative to a binder) may be applied to an individual solid state emitter or group of solid state emitters relative to another solid state emitter or group of emitters. Other materials, such as dispersers, scattering materials, and/or index matching materials, may be included in encapsulants, whether or not combined with lumiphoric materials. Various optical elements, including but not limited to collimators, may also be provided in a solid state emitter package according to embodiments of the present invention.

In one embodiment, at least one lumiphoric material may be remotely located (i.e., spatially separated) from a solid state emitter. Remote placement of at least one lumiphoric material may be accomplished by separating a lumiphoric material from a solid state emitter by an intervening material and/or void. A remotely located lumiphoric material may be insubstantially thermally coupled with an associated solid state emitter. Remote placement of a lumiphoric material may be beneficial to promote mixing between emissions of emitters of different principal colors. In various embodiments, the distance between a solid state emitter and remotely located phosphor(s) may be preferably about 0.5 mm, more preferably about 1.0 mm, more preferably about 1.5 mm.

Emissions from a solid state emitter having an associated lumiphoric material may be fully absorbed by the lumiphor (for responsive conversion to another wavelength), or only partially absorbed to enable passage of a portion of emission from the solid state emitter—such that a solid state emitter and lumiphor in combination may be adapted to emit one color peak or two color peaks (with each color peak preferably being in the visible range).

One or more lumiphoric materials (e.g., one or more first lumiphor(s) and one or more second lumiphor(s)) may be used in embodiments of the present invention. Each of the at least one first lumiphor and the at least one second lumiphor can individually comprise (or can consist essentially of, or can consist of) a phosphor. Each of the at least one lumiphor can, if desired, further comprise (or consist essentially of, or consist of) one or more highly transmissive (e.g., transparent or substantially transparent, or somewhat diffuse) binders, e.g., made of epoxy, silicone, glass, or any other suitable material. For example, if a lumiphor comprises one or more binders, then one or more phosphors can be dispersed within the one or more binders. In general, the thicker the lumiphor, then the lower the weight percentage of the phosphor may be. Depending on the overall thickness of the lumiphor, the weight percentage of the phosphor could be generally any value, e.g., from 0.1 weight percent to 100 weight percent In one embodiment, at least one lumiphoric material is arranged to receive and convert emissions from any of (i) at least one principally red solid state emitter, and/or (ii) at least one principally blue solid state emitter, wherein the lumiphoric material is adapted to generate emit peak emissions of a wavelength that is different from a peak emission wavelength of each of the at least one principally red solid state emitter and the at least one principally blue solid state emitter. The degree of difference between the peak wavelength of the at least one lumiphoric material and the peak wavelength of each of the at least one principally red emitter and the at least one principally blue emitter is preferably at least about 10 nm, more preferably at least about 20 nm, more preferably at least about 30 nm, more preferably at least about 40 nm, and still more preferably at least about 50 nm. In one embodiment, a plurality of solid state emitters comprises at least two solid state emitters having peak emissions of wavelengths at least about 50 nm apart.

In one embodiment, a lumiphoric material is arranged to receive and convert emissions from any of (i) at least one principally red solid state emitter, (ii) at least one principally blue solid state emitter, and/or (iii) at least one supplemental solid state emitter (e.g., principally cyan, principally yellow, and/or principally amber), wherein the lumiphoric material is adapted to generate peak emissions of a wavelength that is different from a peak emission wavelength of each of the at least one principally red solid state emitter, the at least one principally blue solid state emitter, and the at least one supplemental solid state emitter. The degree of difference between the peak wavelength of the at least one lumiphoric material and the peak wavelength of each solid state emitter may be consistent with the prior embodiment. The at least one supplemental solid state emitter may serve to improve CRI Ra for combinations of emitters that would otherwise be characterized by cooler color temperature output. A solid state emitter package according to one embodiment may include one principally red solid state emitter, two principally blue solid state emitters having peak emissions of a wavelength of about 450 nm, and one principally cyan solid state emitter having peak emissions of a wavelength of from about 480 nm to about 490 nm.

In one embodiment, a solid state emitter package includes at least one principally red solid state emitter, at least one principally blue solid state emitter, and at least one lumiphoric material (e.g., a YAG phosphor or other phosphor) adapted in combination to provide a high CRI warm white color temperature. Multiple phosphors and/or at least one supplemental solid state emitter may be added to the foregoing package for additional advantage.

In one embodiment, a solid state emitter package includes at least one principally red solid state emitter comprising a Portland orange solid state emitter, and at least one principally blue solid state emitter, to provide higher efficiency but lower CRI relative to the preceding (e.g., phosphor-enhanced) embodiment.

Referring now to FIG. 1, a solid state light emitter package 50 according to some embodiments of the present invention includes multiple (e.g., four) independently controllable solid state emitters 12A-12D arranged over (i.e., on or adjacent to) a common submount 14 and a common leadframe 11. While four solid state emitters 12A-12D are illustrated in FIG. 1, it is to be understood that any desirable number of solid state emitters may be embodied in a single package. The package 50 includes a molded package body 10 surrounding or at least partially encasing the leadframe 11 and a lens 20 mounted over a central region of the package 50. Although the lens 20 is shown as being substantially hemispherical in shape, other lens shapes may be used. Conductive traces 19 provided on or over the submount 14, and wirebonds 18, provide electrically conductive paths between the emitters 12A-12D and electrical leads 15A-15D and 16A-16D extending from sides of the package body 10. Double wirebonds 18 may be used as desired to facilitate even distribution of electrical current and reduce heating of the wires. The leads 15A-15D, 16A-16D may be arranged such that leads of opposite polarity type (e.g. anodes or cathodes) are provided on opposite sides of the package body 10, which may facilitate the connection of packages using such leadframes in series. Registration features or molding depressions 8A-8D may be provided adjacent to corners of the in the package body 10. A peripheral reflector 21 may be provided below the lens 20. Any of various optional features, such as mixers, diffusers, etc., may be provided in addition to or instead of the lens 20.

The package 50 may have length and width dimensions of 7.0 mm×9.0 mm, inclusive of the leads 15A-15D, 16A-16D following crimping/trimming thereof. Each emitter of the four emitters 12A-12D disposed in the unitary package may be arranged with lateral edge spacing of less than about 1.0 mm, more preferably less than about 0.5 mm, from at least one adjacent emitter. Such close lateral spacing is desirable to approximate a point source, and thereby minimize perception of discrete color sources when multiple emitters of different colors are operated simultaneously—thus promoting color mixing and shadow reduction. Each solid state emitter 12A-12D may have a top emissive surface (facial) area of about 1.0 $mm^2$. Given the presence of four solid state emitters 12A-12D, the ratio of solid state emitter top emissive surface or facial area to total facial package area (of about 63 $mm^2$) is about 4/63, or about 6.3%. In an alternative embodiment, one or more emitters may have a top emissive surface (facial) area of at least about 1.4 $mm^2$; assuming the presence of four such emitters in the same overall facial package area (about 64 $mm^2$), the ratio of solid state emitter top emissive surface or facial area to total facial package area is at least about 5.6/63, or at least about 8.9%. Multi-emitter packages with integral leadframes, and optionally including integral ESD devices, in similar embodiments may be characterized by ratios of solid state emitter top surface (facial) area to total top surface (facial) package area of preferably at least about 4%, more preferably at least about 5%, more preferably at least about 6%, more preferably at least about 7%, more preferably at least about 8%, more preferably at least about 9%, and still more preferably at least about 10%. In a multi-emitter package as described herein, at least one or each different color solid state emitter (e.g., red and blue, optionally supplemented by at least one supplemental emitter) or different solid state emitter/lumiphor combination (e.g., blue emitter/yellow phosphor combination) preferably has a ratio of solid state emitter top surface area or facial area to overall package top facial area of at least about 1/63 (or about 1.6%), more preferably at least about 1.4/63 (or about 2.2%). In one embodiment, such a package is configured with multiple solid state emitters of different principal colors, including at least one lumiphor-converted solid state emitter (e.g., to produce white light or light of any suitable color or dominant that may be different from, or substantially the same as, emissions of one or more of the other solid state emitters).

Presence of multiple independently controllable solid state emitters of different color provides design flexibility for applications requiring color changing with high flux from compact lighting sources. Each emitter of a multi-emitter package as disclosed herein is preferably closely spaced to provide enhanced color mixing and shadow reduction for desired application. In one embodiment, an entertainment light provides spinning color with high luminous flux. In another embodiment, a color changing light bulb includes at least one solid state emitter package, and preferably multiple packages, as disclosed herein. Such color changing light bulb may be of any suitable type, including, but not limited to, R16, MR16, MR16A, and MR16B bulb types.

Emitter packages as disclosed herein may be integrated with or associated with light mixing elements and/or light devices of various types. In one embodiment, spectral content of an emitter package may be shifted by the inclusion of spatially separated lumiphoric material (e.g., lumiphor films), as disclosed in U.S. Patent Application Publication No. 2007/0170447 to Negley, et al., which is incorporated by reference. First and second lumiphors (e.g., lumiphor films, lumiphor coatings, and/or lumiphor dispersions) are spaced from one another. Preferably, at least one second lumiphor is spaced apart from, and outside of, at least one first lumiphor relative to at least one solid state emitter. Such shifting is preferably accomplished to provide combined emission with improved color rendering index. The presence of spaced-apart lumiphors provides enhanced color mixing, as may be beneficial for use with an emitter package including plural solid state emitters arranged to emit different colors, so as to minimize perception of simultaneous emission of distinct colors. Solid state emitter packages (e.g., packages 50, 50') as described herein may be combined with any one or more features as described in the foregoing U.S. Patent Application Publication No. 2007/0170447 to Negley, et al.

In certain embodiments, emitter packages (e.g., packages 50, 50') as described herein may be enhanced and/or tuned using light scattering materials that are arranged in configurations that are non-uniform relative to the emitters as a group, and/or relative to individual emitters, as disclosed by U.S. Patent Application Publication No. 2008/0308825 to Chakraborty, et al. As indicated previously, it is desirable to place emitters of different colors in close proximity to one another to approximate a point source, and thereby minimize perception of discrete color sources when multiple emitters of different colors are operated simultaneously. Emitter packages as disclosed herein that include multiple emitters (or emitters and emitter/phosphor combinations) of different colors (e.g., emitters 12A-12D of FIG. 1) may be operated in combination to generate light that is perceived at white (or a desired color mix) when a viewer is directly facing the package (e.g., substantially perpendicular to an upper surface of the package body 10), but discrete colors of light (rather than white or another desired color mix) might be perceived by a viewer facing the package from the side (e.g., substantially parallel to an upper surface of the package body 10) or at an angle. To overcome this effect without unduly reducing light intensity emitted perpendicular to an upper surface of the package body 10, one or more scattering elements (e.g., scattering elements dispersed in encapsulant) may be arranged to interact with light that would otherwise emanate from the package at a shallow angle, while light emanating from the emitters in a direction perpendicular to the upper surface of the package body 10 may interact with a reduced concentration (e.g., low concentration or zero concentration), or different type, of scattering elements.

The individually controllable solid state emitters may be driven with any appropriate level of current. In one embodiment, each emitter is adapted to be driven with a current of up to at least about 700 mA. In various embodiments, currents of 350 milliamps, 700 milliamps, or more may be supplied to each emitter within a solid state emitter package. In various embodiments, a light emission package as disclosed herein and including multiple emitters of different principal colors has a total lumen output of preferably at least about 300 lumens, more preferably at least about 350 lumens, and still more preferably at least about 400 lumens. In various embodiments, a solid state emitter package as described herein has a CRI of at least about 80. In various embodiments, a solid state emitter package as described herein has an efficacy of at least about 25 lumens per watt.

With continued reference to FIG. 1, the leadframe 11 preferably comprises a thermally conductive material (e.g., a metal), and preferably defines a heatsink that may or may not be electrically active. The submount 14 may comprise a thermally conductive but electrically insulating material (e.g., aluminum nitride, a ceramic, etc.). The submount 14 may be attached to the leadframe 11 using any conventional method, including use of a thermally conductive paste. Given the electrically insulating character of a preferred submount, traces 19 and wirebonds 18 may be provided to establish electrically conductive paths to and from the solid state emitters 12A-12D.

Electrostatic discharge protection (ESD) devices 13A-13D such as Zener diodes (or, alternatively, ESD devices such as ceramic capacitors, transient voltage suppression (TVS) diodes, multilayer varistors, and/or Schottky diodes) are integral to the package 50, and arranged over the submount 14 to protect the solid state emitters 12A-12D from harmful electrostatic discharge. In the illustrated embodiment, each solid state emitter 12A-12D has an associated ESD device 13A-13D. In another embodiment (e.g. if multiple emitters 12A-12D should be connected in series), each separately addressable path or separate conductive path associated with (e.g., in and/or on) the device 50 includes an associated ESD device 13A-13D. Each ESD device 13A-13D may be surface mounted on the submount 14.

A thermally conductive heatsink (e.g., metal or other conductive slug) is preferably provided below and in thermal communication with the submount 14 (e.g. via the leadframe 11) to conduct heat away from the solid state emitters 12A-12D to a bottom side of the package 50. The heatsink is preferably electrically inactive, and may be rendered so through use of an electrically insulating submount. The heatsink may be integrally formed with the leadframe (e.g., as a portion of the leadframe of a thicker gauge or otherwise enhanced mass and/or thickness), or a heatsink may be placed proximate to the leadframe, according to any suitable manufacturing process. If a submount is provided, the heatsink is preferably longer and/or wider than the submount to enhance lateral dispersion of heat emanating from the solid state emitters.

In one embodiment, the submount 14 may be eliminated, with the emitters 12A-12B (and optional ESD devices 13A-13D) being mounted on or over a leadframe 11. The leadframe may or may not be electrically active. If desired to electrically isolate part or all of the leadframe, an electrically insulating material (e.g., thin film or selectively patterned area) may be arranged between the leadframe and the emitters, with electrical traces and/or wirebonds included to provide electrical connection to the emitters and/or ESD devices 13A-13D. Alternatively, or additionally, an electrically insulating material may be disposed between at least a portion of the leadframe and an underlying heatsink or slug to promote electrical isolation of the heatsink or slug. In another embodiment, solid state emitters (with optional ESD devices) may be mounted on or over a heatsink or slug. The heatsink or slug may be electrically active and used as a bottom side contact for devices mounted thereon, with an electrically insulating material optionally being arranged below the heatsink or slug. Alternatively, or additionally, an electrically insulating material may be disposed or selectively patterned between the heatsink or slug and the emitters arranged thereon.

In one embodiment, the emitters 12A-12D include a principally red LED 12D, a first principally blue LED 12B lacking a phosphor (or other lumiphoric material), a second principally blue LED 12C, and a third principally blue LED 12A having an associated yellow (or other) phosphor—with the blue LED 12A/yellow phosphor combination arranged to emit white light. Each solid state emitter 12A-12D is independently controllable via different pairs of the leads 15A-16A, 15B-16B, 15C-16C, 15D-16D. The package 50 may therefore be operated with any one, two, three, or four LEDs 12A-12D.

Although the emitters 12A-12D have been described herewith as embodying a specific combination of solid state emitters and a lumiphor, it is to be appreciated that any desired numbers and colors of solid state emitters and lumiphors as disclosed herein may be employed.

FIGS. 2A-2D depict an emitter device package 50' substantially similar to the package 50 illustrated and described in connection with FIG. 1. The package 50' includes four solid state emitters 12A'-12D' arranged over a common submount 14' and a common leadframe 11'. The package 50' includes a molded package body 10' surrounding the submount 14' and a lens 20' mounted over a central region of the package 50'. Conductive traces 19' provided on or over the submount 14', and wirebonds 18', provide electrically conductive paths between the solid state emitters 12A'-12D' and electrical leads 15A'-15D' and 16A'-16D' extending from sides of the package body 10'. The leads 15A'-15D', 16A'-16D' may be arranged such that leads of opposite polarity type (e.g. anodes or cathodes) are provided on opposite sides of the package body 10'. Registration features or molding depressions 8A'-8D' may be formed adjacent to corners of the package body 10'. A peripheral reflector 21' may be provided below the lens 20'. A thermally conductive heatsink or slug 17' (optionally integrated and/or integrally formed with the leadframe 11') is exposed along a back side of the package 50' and is in thermal communication with the submount 14' to conduct heat away from the solid state emitters 12A'-12D'. The heatsink or slug 17' preferably has an exposed surface area that is larger than a facial area of the submount 14'.

Construction details for, and features of, packages including multiple solid state emitters are disclosed in the following U.S. patents and published patent applications: U.S. Patent Application Publication No. 2008/0121921 to Loh, et al.; U.S. Patent Application Publication No. 2008/0012036 to Loh, et al.; U.S. Patent Application Publication No. 2007/0253209 to Loh, et al.; and U.S. Pat. No. 7,456,499 to Loh, et al. Solid state emitter packages as described herein may be combined with any one or more features of the foregoing U.S. patent and U.S. patent application publications to Loh et al., including, but not limited to: dual thickness leadframe construction; general electrical trace patterns; and materials and methods of fabrication of various components.

In one embodiment, a solid state emitter package (e.g., packages 50, 50') such as described above includes multiple lumiphors in addition to multiple solid state emitters. For example, with comparison to the embodiment of FIG. 1, at least two different LEDs 12A-12D may be coated with different lumiphors (e.g., phosphors). Alternatively, multiple lumiphors arranged to interact with emitters of different colors may be combined, and such combination may be coated (e.g., conformally coated) or otherwise disposed over at least two, at least three, or at least four solid state emitters 12A-12D. For example, multiple lumiphors may be combined with an encapsulant and/or coated on or integrated with a lens, with the multiple phosphors being arranged to interact with one solid state emitter, two solid state emitters, or three or more solid state emitters. Various combinations of multiple lumiphors and multiple solid state emitters are described, for example, in U.S. Patent Application Publication No. 2006/0152140 to Brandes, and U.S. Patent Application Publication No. 2007/0223219 to Medendorp, et al., which are incorporated by reference herein. By appropriate selection of LED die components and phosphor species, a close approach to the color temperature of interest can be achieved in the light output of the light emission device. Sizes (e.g., emissive area or frontal area) and/or numbers of individual emitters disposed within a multi-emitter package may be varied to at least partially compensate for performance differences among emitters of different colors, as described in U.S. Patent Application Publication No. 2006/0152140 to Brandes.

In one embodiment, a solid state emitter package includes a plurality of solid state emitters, a plurality of conductive leads in electrical communication with the plurality of solid state emitters, and at least two spatially separated conductive leads in electrical communication with at least one electrically conductive path associated with the solid state emitter package, wherein the at least one electrically conductive path is not in electrical communication with any solid state emitter of the solid state emitter package. The at least one electrically conductive path may be susceptible to inclusion of a jumper, or inclusion of a control element.

FIG. 3 illustrates a simplified portion 111 of a multi-emitter package including three solid state emitters 112A-112C. Such layout is similar to the layout illustrated in FIG. 2B, but with the omission of a fourth emitter. Electrical leads 115A-115D and 116A-116D extend laterally outward relative to a central region of the package. A submount 114 includes electrically conductive traces or pads 119A, 119B, 120B, 119C, 120C, 119D, 120D, with the submount 114 being used to support the emitters 112A-112C. Each emitter 112A-112C has two associated wirebonds 118 to close an electrical path inclusive of the emitter 112A-112C and associated traces or pads 119A, 119B, 120B, 119C, 120C. Electrically conductive traces 119D, 120D have associated pins 121, 122 arranged in combination to receive an electrically conductive jumper (not shown) adapted to close an electrically conductive path therebetween. Such a jumper and pins 121, 122, together with conductive traces 119D, 120D, wirebonds 118D1, 118D$_2$, and contacts 115D, 116D provide an electrically conductive path associated with the package that is not in electrical communication with any of the solid state emitters 112A-112C. Alternatively, the pins 121, 122 may be replaced with conventional (e.g., soldered) contacts coupleable to a control element (not shown). Such a control element may include, for example, any of a sensor, a switch, a relay, a transistor, a current regulating element, and a voltage regulating element.

Further details regarding utilization of control elements with a multi-emitter package such as described in connection with FIG. 3 are discussed below in connection with FIGS. 4-5. Referring back to FIG. 3, contacts 115D, 116D are spatially segregated from one another, as such contacts are arranged along different (i.e., opposing) sides of a multi-emitter package. If desired, multiple electrically conductive paths similar to the path involving pins 121, 122 may be provided in a single multi-emitter package.

In one embodiment, the at least one electrically conductive path associated with the solid state emitter package (e.g., including multiple solid state emitter) comprises a jumper. Such a jumper may be removably coupled to the solid state emitter package (e.g., via at pins thereof) by a manufacturer or user of the solid state emitter package. Such a jumper may be used to provide interconnections on a personal computer board or other circuit board. This jumper may allow for less complex circuit board layouts and may avoid the need for multi-layer circuit boards (or enable reduction of the number of layers thereof). Multi-layer circuit boards may be expensive, particularly when metal core boards are required. Additionally, using multi-layer metal core boards may reduce the ability to extract heat from an emitter package, as multiple interconnect layers may decrease thermal coupling of a metal circuit board core to the package by increasing the thermal resistance of the interconnection layers. In one embodiment, at least one multi-emitter solid state emitter package including at least two electrically conductive leads in electrical communication with at least one electrically conductive path associated with the solid state emitter package, wherein the at least one electrically conductive path not in electrically conductive communication with any solid state emitter of the solid state emitter package. An electrically conductive path associated with a solid state emitter package may include a path disposed in and/or on the solid state emitter package. At least two electrically conductive leads in electrical communication (e.g., with one another, such as by way of one or more conductive elements disposed in and/or on a solid state emitter package) are preferably spatially separated from one another, with such spatial separation including placement of the conductive leads on different (e.g., adjacent, or opposing) sides of the solid state emitter package. The solid state emitter package is electrically (and preferably also thermally) coupled to a first side of a circuit board lacking a conductive (e.g., metal) core. In one embodiment, multiple emitter packages as previously described are coupled to a common circuit board of such type.

In one embodiment, at least one electrically conductive path associated with a multi-emitter solid state emitter package is coupled to at least one control element. Multiple control elements of similar or different types may be provided, such as in parallel or in series with one another, whether associated with a single electrically conductive path or multiple electrically conductive paths associated with the solid state emitter package. Examples of suitable control elements include, without limitation, sensors, switches, transistors, current regulating elements, and voltage regulating elements. Such control element(s) may be used to control or affect operation of one or more electrically operable elements spatially separated from the solid state emitter package containing the at least one conductive path, or alternatively the control element may be used to control or affect operation of one or more emitters within the solid state emitter package. One or more emitters may therefore be operated responsive to a signal derived from the control element(s).

Referring to FIG. 4, at least a portion of a lighting system 200 includes a solid state emitter package 250 (embodying a layout substantially as illustrated in FIG. 3) in electrical communication with one or more electrically operable elements 241, 242 that are distinct from (e.g., spatially separated from) the emitter package 250. Electrical leads 215A-215D and 216A-216D extend laterally outward on opposing sides relative to a central region of the package 250. Three pairs of leads 215A-216A, 215B-216B, 215C-216C are in electrical communication with three emitters (not shown), respectively, of the package 250. Electrical leads 219D, 220D extend from another side of the package 250 and are in conductive communication with the remaining leads 215D, 216D, respectively. Intervening conductive elements such as wirebonds may be used to facilitate electrically conductive communication between leads 215D, 219D and leads 220D, 216D. A control element 230 is disposed in electrical communication with the leads 219D, 220D, with the control element 230 and leads 215D, 216D, 219D, 220D, forming an electrically conductive path associated with (e.g., in and/or on) the package 250 that is independent of any solid state emitter of the package 250. One or more control elements 230 may be spatially separated from the package 250, which may be advantageous, for example, to permit remote sensing and/or control. One or more electrically operable elements 241, 242, which may be spatially separated from and external to the package 250, may be disposed in electrical communication with the leads 215D, 216D. Since the electrically operable elements 241, 242 are ultimately arranged in electrical communication with the control element 250, the control element 230 may be arranged to control and/or affect operation of such elements 241, 242. The electrically operable elements 241, 242 may include supplemental emitters, cooling elements (e.g., fans, heatpipes, etc.), user-perceptible alarm or indication elements (e.g. arranged to output visible, audible, tactile, or similar alarms or indications), user-perceptible display elements, and similar items. The control element 230 may receive a control input 229, such as may be provided by a manual switch, external processor, or other external signal generating means. In one embodiment, the control element 230 includes a wireless receiver and the control input 229 may be communicated wirelessly to the control element 230.

In various embodiments, the control element 250 may comprise one or more of any of the following: a sensor, a switch, a transistor, a current regulating element, and a voltage regulating element. In certain embodiments, the control element 230 may comprise at least one sensor arranged to sense light—such as presence, absence, color and/or intensity of any of incident light and light generated by one or more emitters of the package 250—and responsively affect operation of the electrically operable elements 241, 242. For example, the electrically operable elements 241, 242 may comprise one or more emitters that may be operated according to need for supplemental lighting (e.g., with respect to color and/or intensity) as determined by ambient light conditions and/or emissions generated by one or more emitters of the package 250. In certain embodiments, the control element 230 may include a motion sensor, an accelerometer, a temperature sensor, a pressure sensor, a moisture sensor, a chemical sensor, a strain gauge, a current sensor, or a voltage sensor.

Referring to FIG. 5, at least a portion of a lighting system 300 includes a solid state emitter package 350 (or primary emitter package 350), embodying a layout substantially as illustrated in FIG. 3, in electrically conductive communication with at least one control element 330 capable of affecting operation of the emitter package 350 and/or one or more external devices (such as a secondary emitter package 450). The at least one control element 330 may include one or more secondary electrically conductive paths arranged to control or affect operation of the emitter packages 350, 450, with the secondary electrically conductive paths not being in electrically conductive communication with a primary conductive path of the emitter package 350 including leads 315D, 319D, 320D, 316D.

Electrical leads 315A-315D and 316A-316D extend laterally outward on opposing sides relative to a central region of the primary emitter package 350. Three pairs of leads 315A-316A, 315B-316B, 315C-316C are in electrical communication with three emitters (not shown), respectively, of the primary package 350. Electrical leads 319D, 320D extend from another side of the package 350 and are in electrically conductive communication with the remaining leads 315D, 316D, respectively. The control element 330 (more specifically, a portion 331 thereof) is disposed in electrical communication with the leads 319D, 320D, with the control element 330 and leads 315D, 316D, 319D, 320D, forming a conductive path associated with the package 350 that is independent of any emitter of the package 350. In one embodiment, the control element 330 may comprise one or more transistors, relays, or other electrically operable switching and/or regulating devices 332, 334, with the portion 331 comprising one or more sensors arranged to generate one or more sensor output signals, with operation of the switching and/or regulating devices 332, 334 being responsive to the one or more sensor output signals. Additional switching and/or regulating elements 335A, 335B, 335C may be associated with leads 315A, 315B, 315C associated with the three emitters (not shown) of the primary solid state emitter device 350. A processing element 328 may also be in electrical communication with the control element 330 to affect operation thereof.

At least one first switching and/or regulating device 332 may be in electrical communication with at least one solid state emitter of the primary solid state emitter package 350. At least one second switching and/or regulating device 334 may be in electrical communication with at least one electrically operative device that is distinct from the primary emitter package 350, such as a secondary solid state emitter package 450 (or at least one control element 435 associated with the secondary package 450) optionally containing four solid state emitters (not shown). As illustrated in FIG. 5, a secondary solid state emitter package 450 may include four lead pairs 415A-416A, 415B-416B, 415C-416C, 415D-416D each having an associated input conductor 410A-410D and providing electrical communication with a different solid state emitter (e.g., as shown in FIG. 2B) of the secondary solid state emitter package 450. A first electrically conductive path including the portion 331 of the control element 330 is independent of one or more additional electrically conductive paths including the switching and/or regulating devices 332, 334. For example, the portion 331 may comprise a sensor, a relay, a transistor, or similar element, including a primary electrically conductive path through a primary segment thereof, and a secondary electrically conductive path through a secondary segment thereof, with the primary and secondary electrically conductive paths not being conductively coupled to one another.

In operation of the system 300, input conductors 310A-310D supply power to the input leads 315A-315D of the primary emitter package 350. The first three leads 315A-315C power three solid state emitters (not shown) of the primary emitter package 350. The fourth lead 315D and associated side lead 319 supply power to a control element 330 (or a portion 331 thereof). Based on conditions sensed by or otherwise dictated to the input portion 331 (e.g., as sensed by a sensor, dictated by an external input, or dictated by the processor 328), the switching and/or regulating devices 332, 334 of the control element 330, in association with the switching and/or regulating elements 335A-335C, 435 associated with the primary and secondary emitter packages, respectively, may control or affect operation one or more emitters of the primary and/or secondary emitter packages 350, 450. In one situation, operation of at least a portion of the primary emitter package 350 may be curtailed or stopped, while operation of at least a portion of the secondary emitter package 450 is increased or initiated (or vice versa). The primary and secondary emitter packages 350, 450 may be operated in tandem, in complementary fashion, or opposite fashion relative to one another to achieve desired light color, intensity, and/or reliability. Automatic switching between packages 350, 450 may be effected based upon attainment of specified conditions (e.g., excess temperature, malfunction/failure, insufficient or undesired emission color and/or intensity). Additional emitters and/or emitter packages may be disposed in series or parallel, and operated in tandem and/or cascading fashion as desired. A large quantity of emitters and/or emitter packages as described herein may be disposed in an array and operated according to any suitable operating mode as disclosed herein to achieve a desired result.

Devices according to the present invention may be used as described in U.S. Pat. No. 7,213,940, which is hereby incorporated by reference as if set forth fully herein. A combination of light exiting a solid state emitter package as disclosed herein, may, in an absence of any additional light, produce a sub-mixture of light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38).

As indicated previously, one aspect of the invention relates to a solid state emitter package including: a plurality of solid state emitters; a plurality of conductive leads in electrical communication with the plurality of solid state emitters; and at least two spatially separated conductive leads in electrical communication with at least one electrically conductive path associated with the solid state emitter package, wherein the at least one electrically conductive path is not in electrically conductive communication with any solid state emitter of the solid state emitter package. In one embodiment, current is independently controllable to each solid state emitter of the plurality of solid state emitters using the plurality of conductive leads. In one embodiment, the plurality of solid state emitters comprises non-white solid state emitters. In one embodiment, each solid state emitter of the plurality of solid state emitters is arranged with lateral edge spacing of less than about 1.0 mm from at least one adjacent solid state emitter of the plurality of solid state emitters. In one embodiment, the plurality of solid state emitters comprises at least two solid state emitters having peak emissions of wavelengths at least about 50 nm apart. In one embodiment, the at least one electrically conductive path associated with the solid state emitter package comprises a jumper. In one embodiment, the at least two spatially separated conductive leads are disposed on different sides of the solid state emitter package. In one embodiment, the at least one electrically conductive path associated with the solid state emitter package comprises at least one control element. In one embodiment, the at least one control element is adapted to control or affect operation of at least one solid state emitter of the plurality of solid state emitters. In one embodiment, the at least one control element is adapted to control or affect operation of at least one electrically operated element that is spatially separated from the solid state emitter package. In one embodiment, the at least one control element comprises any of a sensor, a switch, a transistor, a current regulating element, and a voltage regulating element. In one embodiment, the plurality of solid state emitters includes at least one principally red solid state emitter having peak emissions within a wavelength range of from 590 nm to 680 nm, and at least one principally blue solid state emitter having peak emissions within a wavelength range of from 400 nm to 480 nm, wherein the solid state emitter package is devoid of any principally green solid state emitter having peak emissions within a wavelength range of between 510 nm and 575 nm. In one embodiment, a light emitting device includes a solid state emitter package as described hereinabove, and at least one solid state emitter that is spatially separated from the solid state emitter package and that is operatively coupled to the at least one electrically conductive path associated with the solid state emitter package.

As indicated previously, another aspect of the invention relates to a solid state emitter package including a plurality of solid state emitters, a plurality of first conductive leads in electrical communication with the plurality of solid state emitters; and at least two second conductive leads in electrical communication and disposed on different sides of the solid state emitter package, wherein the at least two second conductive leads are not in electrically conductive communication with any solid state emitter of the plurality of solid state emitters. In one embodiment, the at least one second conductive leads are in electrical communication with at least one control element. In one embodiment, the at least one control element is adapted to control or affect operation of at least one solid state emitter of the plurality of solid state emitters. In one embodiment, the at least one control element is adapted to control or affect operation of at least one electrically operated element that is spatially separated from the solid state emitter package. In one embodiment, the at least one control element comprises any of a sensor, a switch, a transistor, a current regulating element, and a voltage regulating element. In one embodiment, the plurality of solid state emitters includes at least one principally red solid state emitter having peak emissions within a wavelength range of from 590 nm to 680 nm, and at least one principally blue solid state emitter having peak emissions within a wavelength range of from 400 nm to 480 nm, wherein the solid state emitter package is devoid of any principally green solid state emitter having peak emissions within a wavelength range of between 510 nm and 575 nm. In one embodiment, a light emitting device includes a solid state emitter package as described hereinabove, and at least one solid state emitter that is spatially separated from the solid state emitter package and that is in electrical communication with the at least two second conductive leads.

One embodiment includes a lamp including at least one solid state emitter package as disposed herein. Another embodiment includes a light fixture including at least one solid state emitter package as disclosed herein. In one embodiment, a light fixture includes a plurality of solid state emitter packages. In one embodiment, multiple solid state emitter packages as disclosed herein may be operatively connected (e.g., in parallel or in series) and/or integrated in a single lamp or fixture. In one embodiment, multiple solid state emitter packages as disclosed herein may be operatively coupled to a common current adjuster. In another embodiment, each solid state emitter package may have a dedicated current adjuster. In one embodiment, a light fixture is arranged for recessed mounting in ceiling, wall, or other surface. In another embodiment, a light fixture is arranged for track mounting.

In one embodiment, an emitter package as disclosed herein, lamp incorporating at least one such emitter package, or light fixture incorporating at least one such emitter package, is adapted to promote plant growth by emitting an electromagnetic spectrum appropriate for photosynthesis.

In one embodiment, an enclosure comprises an enclosed space and at least one solid state emitter package as disclosed herein, wherein upon supply of current to a power line, the at least one emitter package illuminates at least one portion of the enclosed space. In another embodiment, a structure comprises a surface or object and at least one emitter package as disclosed herein, wherein upon supply of current to a power line, the emitter package illuminates at least one portion of the surface or object. In another embodiment, an emitter package as disclosed herein may be used to illuminate an area comprising at least one of the following: a plant, a greenhouse, a swimming pool, a room, a warehouse, an indicator, a road, a vehicle, a road sign, a billboard, a ship, a toy, an electronic device, a household or industrial appliance, a boat, an aircraft, a stadium, a tree, a window, a yard, and a lamppost.

The foregoing disclosure thus discloses various multi-emitter packages each including multiple LEDs, with features to enhance light output quality, efficiency, and/or controllability, and devices incorporating such packages While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Any of various elements or features recited herein is contemplated for use with other features or elements disclosed herein, unless specified to the contrary. Correspondingly, the invention as hereinafter claimed is intended to be broadly construed and interpreted, as including all such variations, modifications and alternative embodiments, within its spirit and scope.

What is claimed is:

1. A solid state emitter package comprising:
    at least two solid state emitters; and
    at least two conductive leads in electrical communication with one another, wherein the at least two conductive leads are not in electrically conductive communication with any solid state emitter of the at least two solid state emitters.

2. The solid state emitter package of claim 1, wherein the at least two conductive leads are disposed on different sides of the solid state emitter package.

3. The solid state emitter package of claim 1, wherein the at least two conductive leads are in electrical communication with at least one control element.

4. The solid state emitter package of claim 3, wherein the at least one control element is adapted to control or affect operation of at least one solid state emitter of the at least two solid state emitters.

5. The solid state emitter package of claim 3, wherein the at least one control element is adapted to control or affect operation of at least one electrically operated element that is spatially separated from the solid state emitter package.

6. The solid state emitter package of claim 3, wherein the at least one control element comprises a sensor.

7. The solid state emitter package of claim 3, wherein the at least one control element comprises any of a switch, a transistor, a current regulating element, and a voltage regulating element.

8. The solid state emitter package of claim 1, comprising a plurality of additional electrical leads, wherein current is independently controllable to each solid state emitter of the at least two solid state emitters using the plurality of additional electrical leads.

9. The solid state emitter package of claim 1, wherein the at least two solid state emitters comprise non-white solid state emitters.

10. The solid state emitter package of claim 1, wherein each solid state emitter of the at least two solid state emitters is arranged with lateral edge spacing of less than about 1.0 mm from at least one adjacent solid state emitter of the at least two solid state emitters.

11. The solid state emitter package of claim 1, wherein the at least two solid state emitters comprises at least two solid state emitters having peak emission wavelengths at least about 50 nm apart.

12. The solid state emitter package of claim 1, wherein the at least two conductive leads are in electrical communication with one another through an electrically conductive path including a jumper.

13. The solid state emitter package of claim 1, wherein the at least two conductive leads are in electrical communication with a sensor.

14. A light emitting device, including the solid state emitter package of claim 1, and at least one solid state emitter that is spatially separated from the solid state emitter package and that is in electrical communication with the at least two conductive leads.

15. A lamp or light fixture comprising the light emitting device of claim 14.

16. A solid state emitter package comprising:
    at least two solid state emitters;
    at least two first conductive leads in electrical communication with the plurality of solid state emitters; and
    at least two second conductive leads in electrical communication with one another, wherein the at least two second conductive leads are not in electrically conductive communication with any solid state emitter of the at least two solid state emitters.

17. The solid state emitter package of claim 16, wherein the at least two second conductive leads are in electrical communication with at least one control element.

18. The solid state emitter package of claim 17, wherein the at least one control element is adapted to control or affect operation of at least one solid state emitter of the at least two solid state emitters.

19. The solid state emitter package of claim 17, wherein the at least one control element comprises any of a sensor, a switch, a transistor, a current regulating element, and a voltage regulating element.

20. The solid state emitter package of claim 1, wherein the at least two second conductive leads are in electrical communication with a sensor.

* * * * *

UNITED STATES PATENT AND TRADEMARK OFFICE
CERTIFICATE OF CORRECTION

PATENT NO. : 8,362,499 B2  Page 1 of 1
APPLICATION NO. : 13/008898
DATED : January 29, 2013
INVENTOR(S) : Antony Paul van de Ven et al.

It is certified that error appears in the above-identified patent and that said Letters Patent is hereby corrected as shown below:

On the Title Page, Item (54) and in the specification, Column 1, lines 1-2, title, "SOLID STATE EMITTER PACKAGES INCLUDING ACCESSORY LENS" should be -- SOLID STATE EMITTER PACKAGES INCLUDING ACCESSORY LEADS --.

Signed and Sealed this
Seventh Day of May, 2013

Teresa Stanek Rea
*Acting Director of the United States Patent and Trademark Office*